United States Patent
Tressler et al.

(10) Patent No.: US 9,304,856 B2
(45) Date of Patent: *Apr. 5, 2016

(54) IMPLEMENTING ECC CONTROL FOR ENHANCED ENDURANCE AND DATA RETENTION OF FLASH MEMORIES

(71) Applicant: International Business Machines Corporation, Armonk, NY (US)

(72) Inventors: Gary A. Tressler, Sandy Hook, CT (US); Diyanesh Babu C. Vidyapoornachary, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/305,045

(22) Filed: Jun. 16, 2014

(65) Prior Publication Data

US 2015/0199232 A1 Jul. 16, 2015

Related U.S. Application Data

(63) Continuation of application No. 14/152,367, filed on Jan. 10, 2014.

(51) Int. Cl.
| | |
|---|---|
| *H03M 13/00* | (2006.01) |
| *G06F 11/10* | (2006.01) |
| *G11C 29/52* | (2006.01) |

(Continued)

(52) U.S. Cl.
CPC .......... *G06F 11/1068* (2013.01); *G11C 16/349* (2013.01); *G11C 29/10* (2013.01); *G11C 29/42* (2013.01); *G11C 29/52* (2013.01); *H03M 13/29* (2013.01); *G11B 20/1833* (2013.01); *G11C 16/34* (2013.01); *G11C 29/02* (2013.01); *G11C 29/34* (2013.01); *G11C 29/36* (2013.01); *G11C 2029/0409* (2013.01);

(Continued)

(58) Field of Classification Search
CPC ............ H03M 13/29; H03M 13/2957; H03M 13/2906; H03M 13/27; G11C 29/10; G11C 29/56; G11C 29/02; G11C 29/34; G11C 29/36; G11C 16/34; G11C 16/3404; G11B 20/1833
USPC ........................................ 714/755, 721, 773
See application file for complete search history.

(56) References Cited

U.S. PATENT DOCUMENTS

| | | | | |
|---|---|---|---|---|
| 5,077,737 A | * | 12/1991 | Leger .................. | G06F 11/1004 714/6.1 |
| 7,900,118 B2 | | 3/2011 | Chang et al. | |

(Continued)

*Primary Examiner* — Esaw Abraham
*Assistant Examiner* — Osman Alshack
(74) *Attorney, Agent, or Firm* — Joan Pennington

(57) ABSTRACT

A method, system and memory controller are provided for implementing ECC (Error Correction Codes) control to provide enhanced endurance and data retention of flash memories. The memory controller includes a VT (threshold voltage) monitor to determine VT degradation of cells and blocks; the VT monitor configured to store information about the determined VT degradation; a first ECC engine having a first level of ECC capability; a second ECC engine having a second level of ECC capability, the second level higher than the first level, the second ECC engine having a longer latency than the first ECC engine; a logic to issue a read request to a particular cell/block, and, using the determined VT degradation, use the first ECC engine if the determined VT degradation is less than a threshold and to use the second ECC engine if the determined VT degradation is above the threshold.

9 Claims, 8 Drawing Sheets

(51) Int. Cl.
  H03M 13/29 (2006.01)
  G11C 29/10 (2006.01)
  G11C 29/42 (2006.01)
  *H03M 13/27* (2006.01)
  *G11C 29/02* (2006.01)
  *G11B 20/18* (2006.01)
  *G11C 29/34* (2006.01)
  *G11C 29/36* (2006.01)
  *G11C 16/34* (2006.01)
  *G11C 29/04* (2006.01)

(52) U.S. Cl.
  CPC ...... *G11C 2029/0411* (2013.01); *H03M 13/27* (2013.01); *H03M 13/2906* (2013.01); *H03M 13/2957* (2013.01)

(56) References Cited

U.S. PATENT DOCUMENTS

| | | | |
|---|---|---|---|
| 8,112,692 B2 * | 2/2012 | Lee | G06F 11/1068 365/185.09 |
| 8,161,354 B2 * | 4/2012 | Chen | G06F 11/1068 714/6.13 |
| 8,370,709 B2 * | 2/2013 | Ware | G06F 11/1072 714/763 |
| 2005/0022065 A1 * | 1/2005 | Dixon | G06F 11/106 714/42 |
| 2005/0073884 A1 | 4/2005 | Gonzalez et al. | |
| 2007/0168564 A1 * | 7/2007 | Conley | G06F 12/0866 710/1 |
| 2008/0123419 A1 * | 5/2008 | Brandman | G06F 11/1072 365/185.09 |
| 2009/0125790 A1 | 5/2009 | Iyer et al. | |
| 2009/0164704 A1 | 6/2009 | Kanade et al. | |
| 2009/0183052 A1 * | 7/2009 | Kanno | G06F 11/1068 714/763 |
| 2010/0100797 A1 | 4/2010 | Chen | |
| 2011/0228601 A1 | 9/2011 | Olbrich et al. | |
| 2011/0302477 A1 * | 12/2011 | Goss | G06F 11/1068 714/773 |
| 2012/0278681 A1 | 11/2012 | Moyer | |
| 2013/0024742 A1 * | 1/2013 | Nazarian | G06F 11/1072 714/758 |
| 2014/0059405 A1 * | 2/2014 | Syu | G11C 16/349 714/773 |
| 2014/0095110 A1 * | 4/2014 | Chen | G06F 12/00 702/179 |
| 2014/0185377 A1 * | 7/2014 | Kim | G11C 16/26 365/185.03 |

* cited by examiner

| ID | CAPABILITY | INITIATION | OPERATION | MODE (BACKGROUND OR MAINLINE OR BOTH) | FEATURE ENABLEMENT |
|---|---|---|---|---|---|
| 1 | SOFT INFORMATION PROCESSING | CONTROLLER/ DEVICE (AS A BACK GROUND, BUT PROGRAMMED BY CONTROLLER) | FTME (THROUGH TEST MODE INTERFACE) | | |
| | VT DISTRIBUTION OF A CELL/ BLOCK THROUGH MULTIPLE READS | | | BOTH | OPTIMUM VT READ LEVEL SELECTION FOR RELIABLE READ |
| | VT MEASUREMENT OF A CELL/ BLOCK | | | BOTH | DEGRADATION MEASUREMENT INFLUENCES THE SELECTION OF RIGHT LEVEL ECC ENGINE |
| 2 | SCRUB | CONTROLLER/ DEVICE (AS A BACK GROUND, BUT PROGRAMMED BY CONTROLLER) | FTME (THROUGH DATA MODE INTERFACE) | BOTH | SUPPORT DATA VERIFICATION TO ENSURE DATA CORRECTION CAPABILITIES WITHIN SPECIFIED LEVELS |
| 3 | REAL-TIME PARAMETRIC TRIGGERED OPERATION | DEVICE (PARAMETRIC FEED ENGINE) | FTME (THROUGH DATA INTERLEAVE ENGINE AND/OR TEST MODE INTERFACE) | BACKGROUND | AFTER ANY WIDE VARIATION IN TEMP RANGE (OR SUDDEN TEMP PEAK), ENSURE DATA INTEGRITY OF BLOCKS |

| INITIAL ECC ENGAGEMENT | |
|---|---|
| BLOCK ID | ECC ENGINE USED |
| 1 | #1 |
| 2 | #1 |
| 3 | #1 |
| 4 | #1 |
| 5 | #1 |
| 6 | #1 |
| 7 | #1 |
| 8 | #1 |
| 9 | #1 |
| 10 | #1 |
| 11 | #1 |
| 12 | #1 |
| 13 | #1 |
| 14 | #1 |
| 15 | #1 |
| 16 | #1 |
| 17 | #1 |
| 18 | #1 |
| 19 | #1 |
| 20 | #1 |

| ECC ENGAGEMENT AT LATER TIME (AFTER PERFORMING MAINTENANCE) | | |
|---|---|---|
| BLOCK ID | ECC ENGINE USED | CAUSE |
| 1 | #1 | #1 |
| 2 | #1 | #1 |
| 3 | #1 | #1 |
| 4 | #1 | #1 |
| 5 | #1 | #1 |
| 6 | #1 | #1 |
| 7 | #1 | #1 |
| 8 | #1 | #1 |
| 9 | #2 | BROADER VT WIDENING |
| 10 | #1 | #1 |
| 11 | #1 | #1 |
| 12 | #3 | VT DEGRADATION OF MULTIPLE CELLS |
| 13 | #1 | #1 |
| 14 | #1 | #1 |
| 15 | #1 | #1 |
| 16 | #1 | #1 |
| 17 | #1 | #1 |
| 18 | #1 | #1 |
| 19 | #1 | #1 |
| 20 | #1 | #1 |

FIG. 4B

IMPLEMENTING ECC CONTROL FOR ENHANCED ENDURANCE AND DATA RETENTION OF FLASH MEMORIES

This application is a continuation application of Ser. No. 14/152,367 filed Jan. 10, 2014.

FIELD OF THE INVENTION

The present invention relates generally to the data processing field, and more particularly, relates to a method, system and memory controller for implementing ECC (Error Correction Codes) control to provide enhanced endurance and data retention of flash memories.

DESCRIPTION OF THE RELATED ART

ECC provide a method used to detect and correct errors introduced during data storage or transmission. ECC requirements increase significantly with process technology advancements; and the requirement of bit error rate (BER) correction capabilities varies by technology.

Use of flash memories, for example, with the proliferation of solid state drive (SSD) technology into enterprise market segment, presents numerous challenges. High availability of reliable data is one important requirement. Endurance and data retention decrease significantly as process geometry shrinks. Endurance typically is limited to an expected number of program/erase cycles of a cell. Typically the majority of cell failures are caused by excessive charge trapping in gate oxides. Data retention typically is limited by charge that is lost on the floating gate over time.

Intrinsic NAND operational modes affect reliability. Program disturb errors due to charge collected on floating gate can cause the cell to appear to be weakly programmed. Read disturb pages not selected for read can see elevated voltage stress. If enough charge collects on the floating gate, cells can appear to be charged, causing a flipped bit.

Scaling can present reliability challenges and aggravate cell to cell interferences. Cell disturb activity on adjacent pages or cells can cause gradual buildup of charge on floating gate.

System parametric affects reliability, for example, failures due to high temperatures. High temperatures accelerates rate of charge loss, and charge de-trapping can occur, impacting data retention. Gross errors affect reliability, for example, failures due to defects and shorts.

A need exists for an effective mechanism to enable enhanced ECC (Error Correction Codes) control to provide enhanced endurance and data retention of flash memories. It is desirable to provide such mechanism that enables needed robustness to support enhanced Reliability, Availability, and Serviceability (RAS) features.

SUMMARY OF THE INVENTION

Principal aspects of the present invention are to provide a method, system and memory controller for implementing ECC (Error Correction Codes) control to provide enhanced endurance and data retention of flash memories. Other important aspects of the present invention are to provide such method, system and computer program product substantially without negative effects and that overcome many of the disadvantages of prior art arrangements.

In brief, a method, system and memory controller are provided for implementing ECC (Error Correction Codes) control to provide enhanced endurance and data retention of flash memories. A memory controller for a flash memory includes a VT (threshold voltage) monitor to determine VT degradation of cells and blocks; the VT monitor configured to store information about the determined VT degradation; a first ECC engine having a first level of ECC capability; a second ECC engine having a second level of ECC capability, the second level higher than the first level, the second ECC engine having a longer latency than the first ECC engine; a logic to issue a read request to a particular cell/block, and, using the determined VT degradation, use the first ECC engine if the determined VT degradation is less than a threshold and to use the second ECC engine if the determined VT degradation is above the threshold.

In accordance with features of the invention, the first and second ECC engines in memory controller accommodate a broad range of error correction capabilities as demanded by technology and also sustain endurance by mitigating the cell failures arising during device operation.

In accordance with features of the invention, the VT (threshold voltage) monitor determines VT degradation of cells and blocks in a background process.

In accordance with features of the invention, diagnostic and recovery capabilities are enabled that may arise due to cell level defects because of parametric variations, such as high temperature that causes charge loss.

In accordance with features of the invention, diagnostic and recovery capabilities are enabled that may arise due to predicted cell level failure rates using predefined information data associated with a type of flash memory.

In accordance with features of the invention, the memory controller stores the ECC engine required for each block.

BRIEF DESCRIPTION OF THE DRAWINGS

The present invention together with the above and other objects and advantages may best be understood from the following detailed description of the preferred embodiments of the invention illustrated in the drawings, wherein:

FIG. 2 is a chart illustrating exemplary capabilities of the memory system of FIG. 1 for implementing ECC (Error Correction Codes) control to provide enhanced endurance and data retention of flash memories in accordance with preferred embodiments;

FIGS. 4A and 4B are diagrams illustrating respective example ECC initial selection and at a later time in the example memory system of FIG. 1 in accordance with the preferred embodiment;

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, system and memory controller are provided for implementing ECC (Error Correction Codes) control to provide enhanced endurance and data retention of flash memories.

Figure 1:
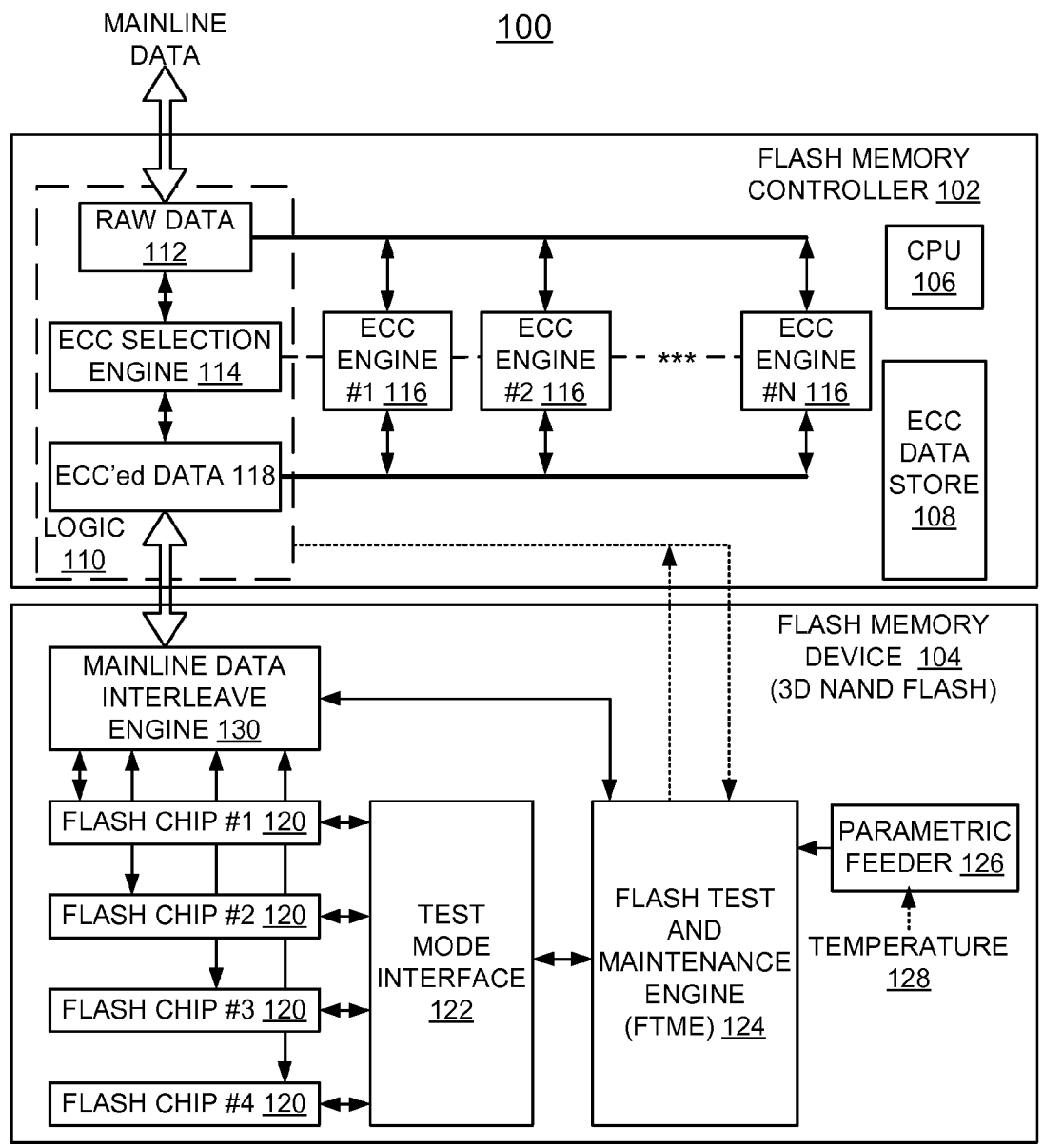
FIG. 1 illustrates an example memory system for implementing ECC (Error Correction Codes) control to provide enhanced endurance and data retention of flash memories in accordance with preferred embodiments.

Having reference now to the drawings, in FIG. 1, there is shown an example memory system generally designated by the reference character 100 for implementing ECC (Error Correction Codes) control to provide enhanced endurance and data retention of flash memories in accordance with the preferred embodiment.

Memory system 100 includes a memory controller 102 coupled to a memory device 104, such as a 3D NAND flash memory device. Memory controller 102 includes one or more processors or central processor units (CPUs) 106, an ECC data store 108 storing control code, and controller logic 110. The controller logic 110 includes a raw data block 112 receiving mainline data and coupled to an ECC selection engine 114 identifying and storing an ECC engine required for each block in the flash memory device 104, and a plurality of ECC engines 116, #1-#N, and an ECCed data block 118 coupled to the flash memory device 104, the ECC selection engine 114, and the plurality of ECC engines 116, #1-#N.

Memory device 104 includes one or more flash chips 120, #1-N, such as 3D NAND flash chips coupled via a test mode interface 122 to a flash test and maintenance engine (FTME) 124. A parametric feeder 126 receiving predefined parametric data including temperature 128 provides predefined parametric data to the FTME 124. Memory device 104 includes a mainline data interleave engine 130 coupled to memory controller 102, each of the flash chips 120, #1-N and to the FTME 124.

Memory system 100 is shown in simplified form sufficient for understanding the present invention. The illustrated memory system 100 is not intended to imply architectural or functional limitations. The present invention can be used with various hardware implementations and systems and various other internal hardware devices.

Referring to FIG. 2, there is shown a diagram illustrating system capabilities generally designated by the reference character 200 in the memory system 100 in accordance with the preferred embodiments. ECC capabilities 200 includes soft information processing initiated by the controller 102, with the FTME 124 used to measure and process soft information, cell level parametric details to drive atomic operations. ECC capabilities 200 includes VT distribution of a cell/block through multiple reads to identify optimum VT read level selection for reliable read operations, and VT measurement of a cell/block for degradation measurement that influences the selection a right level ECC engine 116. ECC capabilities 200 includes background scrub to ensure error levels are below possible correction levels without affecting customer mainline operation. ECC capabilities scrub operation is provided with the FTME 124 using the mainline data interleave engine 130 performing measurement operations without affecting mainline operation. The scrub operations advantageously enable data verification to ensure data correction capabilities within specified limits. ECC capabilities 200 includes real-time parametric triggered operation with the device parametric feeder initiating the FTME 124 using the mainline data interleave engine 130 and/or the test mode interface 122 using the background mode to identify any wide variation in temperature range, or sudden temperature peak, to ensure data integrity of blocks.

Figure 3:
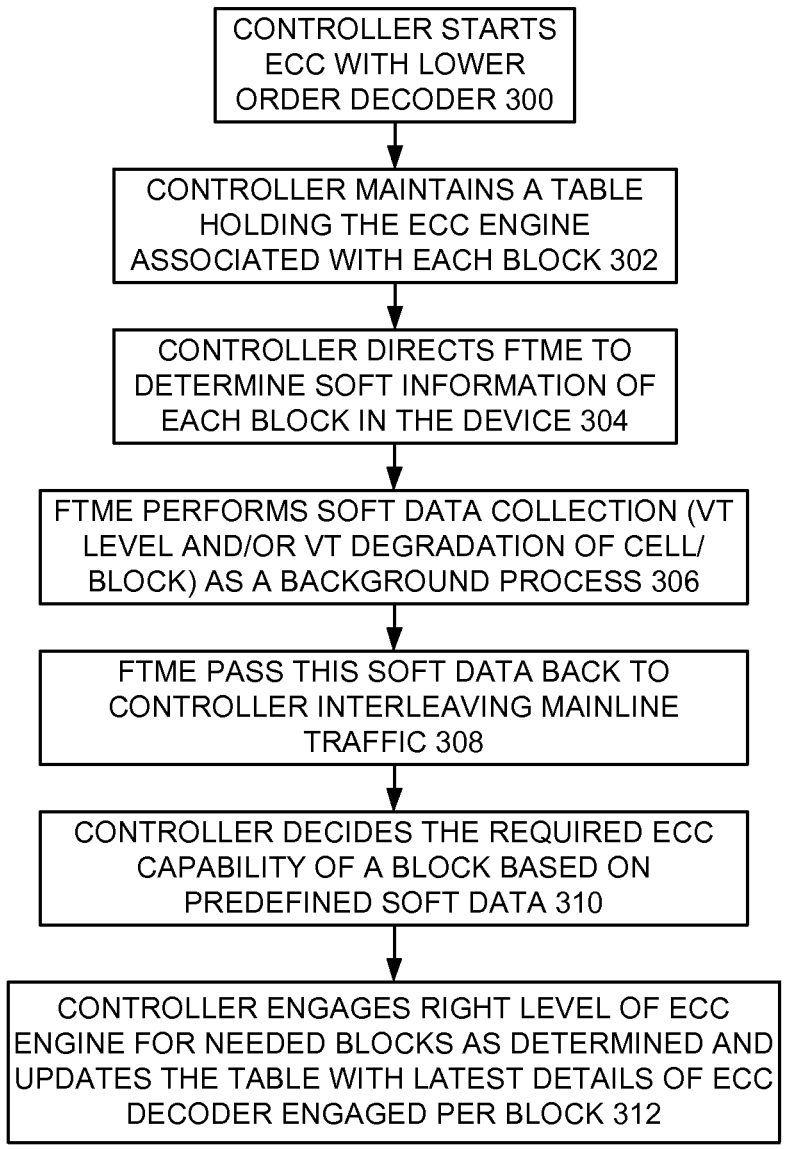
FIG. 3 is a flow chart illustrating exemplary operations for implementing ECC (Error Correction Codes) control methods in the memory system of FIG. 1 in accordance with preferred embodiments.

Referring to FIG. 3, there are shown exemplary operations for implementing ECC (Error Correction Codes) control methods in the memory system 100 of FIG. 1 in accordance with one preferred embodiment. As indicated in a block 300, the memory controller 102 starts ECC with the lower order decoder. The controller 102 maintains a table holding the ECC engine associated with each block of the flash memory as indicated in a block 302. As indicated in a block 304, the controller 102 directs the FTME to determine soft information of each block in the flash memory device 104. The FTME performs soft data collection including VT level and/or VT degradation of cell/block, as a background process as indicated in a block 306. The FTME passes this soft data back to the controller interleaving mainline traffic as indicated in a block 308. The controller 102 determines the required ECC capability of a block based on the predefined soft data as indicated in a block 310. The controller 102 determines that more ECC capability is needed for the block with identified VT widening which may cause multiple cell failures (prediction) at block 310. At block 310, the controller 102 determines that more ECC capability is needed for the block with identified VT degradation of one or more cells in a block which may cause cells to be flipped. Also at block 310, the controller 102 determines that more ECC capability is needed for the block with latent defects such as short circuits of one or more cells in the block. As indicated in a block 312, the controller 102 engages the right level of ECC engine for needed blocks as determined and updates the table with latest details of ECC decoder engaged per block.

FIGS. 4A and 4B are diagrams illustrating respective example ECC initial selection and at a later time in the memory system 100 in accordance with the preferred embodiments. In FIG. 4A, the example ECC initial selection generally designated by the reference character 400, each of the blocks includes the first ECC engine 116, #1 used. In FIG. 4B, the example ECC selection generally designated by the reference character 450 at a later time after performing maintenance, the blocks #1-#8, #10-#11, and #13-#20 includes the first ECC engine 116, #1 being used; and block #9 includes the second ECC engine 116, #2 used due to identifying broader VT widening and block #12 includes the third ECC engine 116, #3 used due to identifying VT degradation of multiple cells. The ECC engines 116, #2-#3 having a higher level of ECC capability, where each of the second and third levels is higher than the first level, the second ECC engine 116, #2-#3 having a longer latency than the first ECC engine FIGS. 5 and 6, there are shown exemplary operations for implementing ECC (Error Correction Codes) control methods in the memory system 100 of FIG. 1 in accordance with preferred embodiments.

Figure 5:
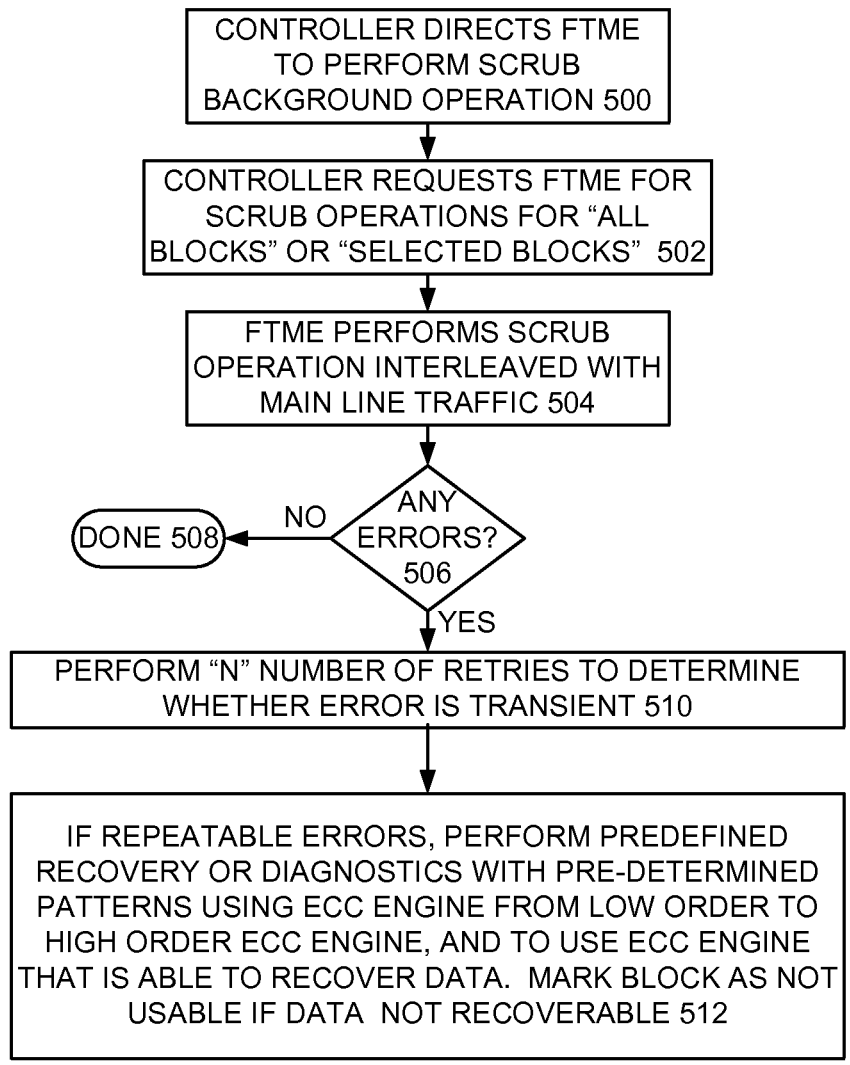
FIGS. 5 and 6 are respective flow charts illustrating exemplary operations of the memory system of FIG. 1 for implementing ECC (Error Correction Codes) control to provide enhanced endurance and data retention of flash memories in accordance with preferred embodiments.

In FIG. 5, the controller 102 directs the FTME 124 to perform scrub background operation as indicated in a block 500. The controller 102 request the FTME 124 for scrub operations for all blocks or selected blocks as indicated in a block 502. The FTME 124 performs scrub operation interleaved with main line traffic as indicated in a block 504.

Checking for any errors is performed as indicated in a decision block 506. When an error is not identified, the operations end as indicated in a block 508. When any errors are identified, a number N of retries is performed to determine whether the error is a transient error as indicated in a block 510. As indicated in a block 512, if repeatable errors not correctable with the initial ECC engine, predefined recovery or diagnostics are performed with pre-determined patterns using ECC engine from low order to high order ECC engine, to identify the ECC engine that is able to recover data to use; or mark block as not usable if data is not recoverable.

Figure 6:
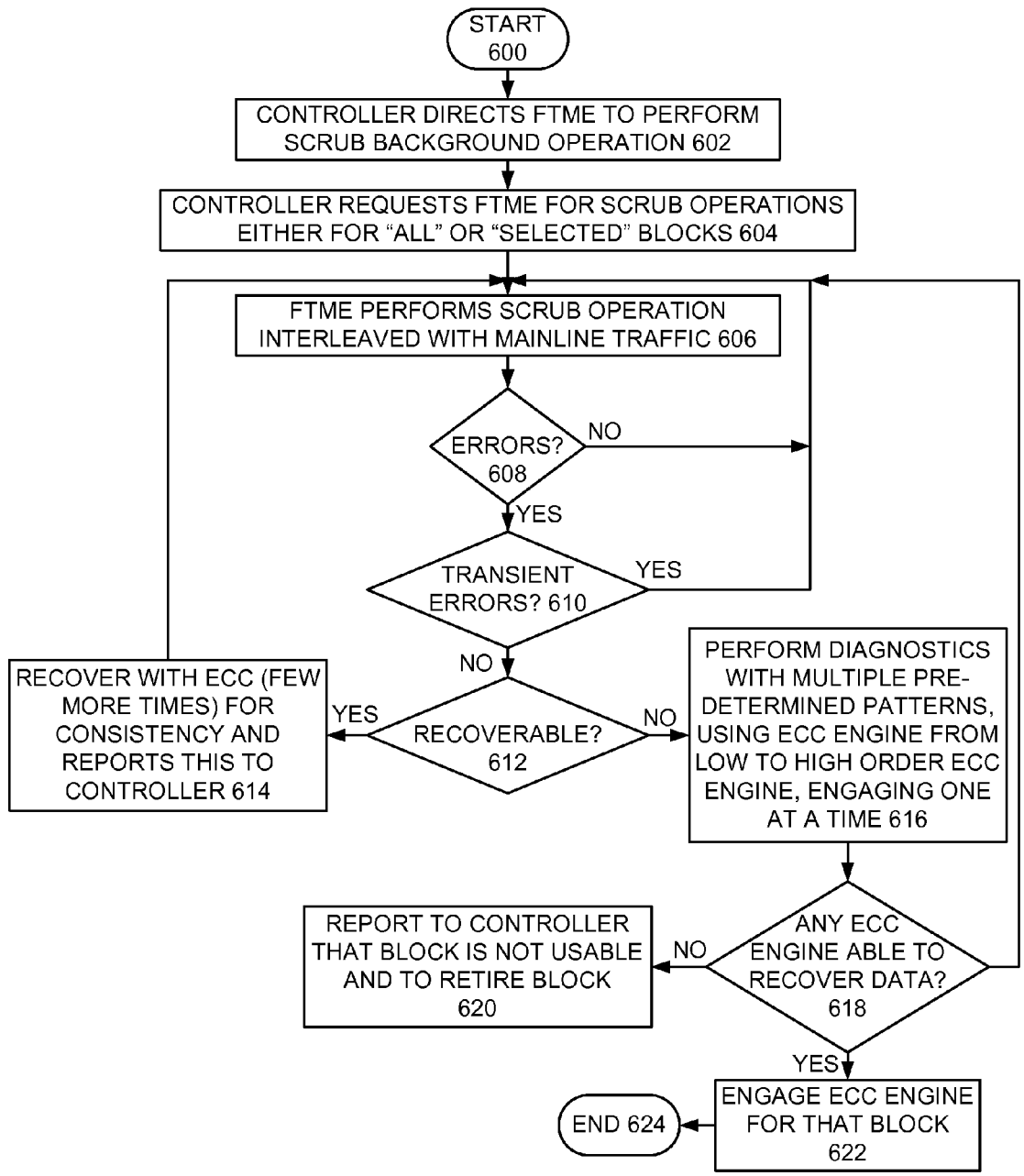

In FIG. 6, more detailed exemplary operations are shown for implementing an atomic scrub ECC control method starting at a block 600. The controller 102 directs the FTME 124 to perform scrub background operation as indicated in a block 602. The controller 102 request the FTME 124 to perform scrub operations for all blocks or selected blocks as indicated in a block 604. The FTME 124 performs scrub operation interleaved with main line traffic as indicated in a block 606. Checking for any errors is performed as indicated in a decision block 608. When an error is not identified, the operations return to block 606. When any errors are identified, checking for transient errors is performed as indicated in a decision block 610. When transient errors are identified, the operations return to block 606. When no transient errors is identified, then checking for a recoverable error is performed as indicated in a decision block 612. When the recoverable error is identified, then the FTME 124 recovers with ECC a few more times for consistency and reports this to the controller as indicated in a block 614. When a recoverable error is not identified, then the FTME 124 performs diagnostics with multiple predetermined patterns, using ECC engine from low to high order ECC engine, engine one at a time as indicated in a block 616. Checking if any ECC engine is able to recover data is performed as indicated in a decision block 618. If not, then the FTME 124 reports to the controller that block is not usable and to retire that block as indicated in a block 620. When an ECC engine is able to recover data, then that ECC engine is engaged for that block as indicated in a block 622. The operations end as indicated in a block 624.

Figure 7:
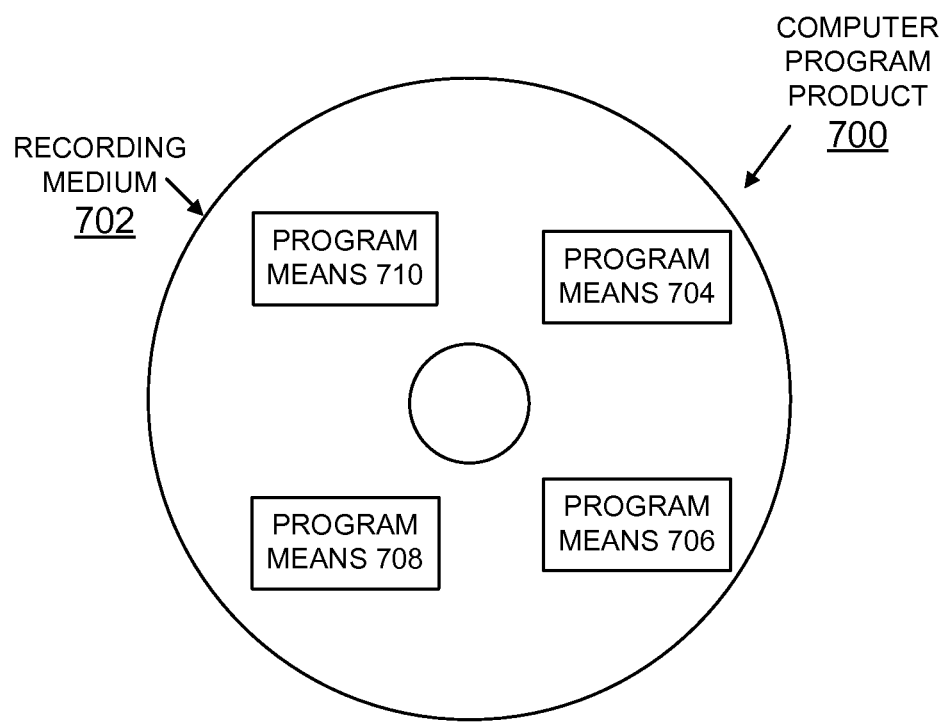
FIG. 7 is a block diagram illustrating a computer program product in accordance with the preferred embodiment.

Referring now to FIG. 7, an article of manufacture or a computer program product 700 of the invention is illustrated. The computer program product 700 is tangibly embodied on a non-transitory computer readable storage medium that includes a recording medium 702, such as, a floppy disk, a high capacity read only memory in the form of an optically read compact disk or CD-ROM, a tape, or another similar computer program product. Recording medium 702 stores program means 704, 706, 708, and 710 on the medium 702 for carrying out the methods for implementing ECC (Error Correction Codes) control of the preferred embodiment in the memory system 100 of FIG. 1.

A sequence of program instructions or a logical assembly of one or more interrelated modules defined by the recorded program means 704, 706, 708, and 710, direct the memory system 100 for implementing ECC control of the preferred embodiments.

While the present invention has been described with reference to the details of the embodiments of the invention shown in the drawing, these details are not intended to limit the scope of the invention as claimed in the appended claims.

What is claimed is:

1. A method for implementing ECC (Error Correction Codes) control in a flash memory system comprising:
   providing a flash test and maintenance engine (FTME) coupled to each flash chip in the flash memory system;
   monitoring in a background process a VT (threshold voltage) to determine VT degradation of cells and blocks in a flash memory with the FTME used to measure and process VT measurement and determine VT degradation of the of cells and blocks in each flash chip in the flash memory system;
   providing a first ECC engine having a first level of ECC capability;
   providing a second ECC engine having a second level of ECC capability, the second level higher than the first level, the second ECC engine having a longer delay than the first ECC engine;
   responsive to receiving a read request to a particular cell/block, comparing the determined VT degradation with a threshold, and
   using the first ECC engine if the determined VT degradation is less than the threshold and using the second ECC engine if the determined VT degradation is above the threshold.

2. The method as recited in claim 1 includes initially providing the first ECC engine having the first level of ECC capability for each cell/block in the flash memory.

3. The method as recited in claim 1 includes performing soft data collection including monitoring the VT (threshold voltage) to determine VT degradation of cells and blocks in the flash memory as a background process.

4. The method as recited in claim 3 includes responsive to monitoring the VT (threshold voltage), identifying a VT read level selection for a reliable read operation.

5. The method as recited in claim 1 includes performing a scrub operation as a background process and interleaved with a mainline data process.

6. The method as recited in claim 5 includes responsive to identifying an error, performing predefined diagnostics with multiple predetermined patterns.

7. The method as recited in claim 1 includes identifying an ECC engine able to recover data for a cell/block, and storing an updated ECC engine used for the cell/block.

8. The method as recited in claim 1 wherein said threshold is a selected value associated with a type of the flash memory.

9. The method as recited in claim 1 includes providing a flash test and maintenance engine (FTME) in the flash memory, said FTME coupled to said memory controller and each flash chip in the flash memory for performing scrub operations to ensure error levels are below a possible correction level.

\* \* \* \* \*